(12) United States Patent
Toby et al.

(10) Patent No.: US 10,372,857 B2
(45) Date of Patent: Aug. 6, 2019

(54) DETERMINING PARAMETERS OF PCB STRUCTURES

(71) Applicant: HEWLETT PACKARD ENTERPRISE DEVELOPMENT LP, Houston, TX (US)

(72) Inventors: Benjamin Toby, Fort Collins, CO (US); Karl J. Bois, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 553 days.

(21) Appl. No.: 15/138,858

(22) Filed: Apr. 26, 2016

(65) Prior Publication Data
US 2017/0308627 A1 Oct. 26, 2017

(51) Int. Cl.
G06F 17/50 (2006.01)

(52) U.S. Cl.
CPC .................................. *G06F 17/505* (2013.01)

(58) Field of Classification Search
CPC ...................................................... G06F 17/505
USPC ............................................................ 716/137
See application file for complete search history.

(56) References Cited

U.S. PATENT DOCUMENTS

| | | | |
|---|---|---|---|
| 5,625,578 A | 4/1997 | Du Cloux et al. | |
| 6,795,950 B2 | 9/2004 | Matsushita et al. | |
| 6,971,077 B1* | 11/2005 | Frank | G06F 17/5018 716/112 |
| 7,707,525 B2 | 4/2010 | Varon-Weinryb | |
| 7,752,587 B2* | 7/2010 | Jiang | G06F 17/5072 716/122 |
| 7,761,828 B2 | 7/2010 | Miczo | |
| 8,214,788 B2* | 7/2012 | Suaya | G06F 17/5036 716/136 |
| 2004/0039558 A1* | 2/2004 | Qi | G06F 17/5036 703/14 |
| 2005/0251767 A1 | 11/2005 | Shah et al. | |
| 2008/0230258 A1* | 9/2008 | Shen | H05K 1/0218 174/251 |
| 2010/0201465 A1* | 8/2010 | McKinzie, III | H01P 1/16 333/251 |
| 2012/0116735 A1 | 5/2012 | Guedon et al. | |

OTHER PUBLICATIONS

Bogatin, Eric, Effects of Corners In PCB Traces, CircuitCalculator. com, [1] OLL-116 Separating Myth From Reality in Signal Integrity, http://www.BeTheSignal.com, 10 pgs.

* cited by examiner

*Primary Examiner* — Jack Chiang
*Assistant Examiner* — Brandon Bowers
(74) *Attorney, Agent, or Firm* — Sheppard Mullin Richter & Hampton LLP

(57) ABSTRACT

One example includes a machine-readable storage medium encoded with instructions. The instructions are executable by a processor of a system to cause the system to receive at least one target electrical characteristic indicating a target impedance of a passive printed circuit board (PCB) structure. The passive PCB structure is a component of a serial communication channel. The instructions are executable by the processor to cause the system to divide the passive PCB structure into a plurality of elements. Each element has an input and an output. The instructions are executable by the processor to cause the system to determine at least one parameter of each element such that an image impedance of the input and the output of each element equals the target impedance.

15 Claims, 4 Drawing Sheets

DETERMINING PARAMETERS OF PCB STRUCTURES

BACKGROUND

A printed circuit board (PCB) may include serial communication channels to transfer data between components. The serial communication channels may include single-ended transmission lines or differential transmission lines. Serial communication channels of a PCB may include signal traces, vias, coupling capacitors, and/or other passive structures for transmitting signals through the PCB.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Passive printed circuit board (PCB) structures, such as signal traces, vias, coupling capacitors, etc., may be used as components of a serial communication channel. The passive PCB structures may become performance bottlenecks at high bit rates as the parasitic elements of the passive PCB structures become notable and/or electrically large. Passive PCB structures are typically designed by intuition-guided but analytically blind monte carlo optimization using full-wave simulations. Such a design methodology often produces usable results, but consumes valuable time and compute resources.

Accordingly, as described herein, a process is presented that allows for intelligently and deliberately designing passive PCB structures in a way that minimizes the impact of full-wave simulation. This is accomplished by dividing the analysis of each passive PCB structure into electrically smaller elements and modifying at least one parameter of each element using electromagnetic simulation (e.g., quasi-static three-dimensional (3D) or two-dimensional (2D) simulation) or another suitable method to produce an image impedance at each input and output of each element that is equal to the desired characteristic impedance either alone or when concatenated with a minimal number of adjacent elements. As each element or substructure possesses an equal image impedance at the input and the output of the element or substructure, the structure as a whole will predictably present the same image impedance at the input and the output of the structure as a whole.

Using this process, the design time for passive PCB structures is decreased compared to the typical time used for the compute resource heavy monte carlo optimization design process. In addition, the understanding of each structure enabled by the disclosed process minimizes situations where a structure is optimized (e.g., tuned) in an unanticipated and/or in an unintended manner. Unintentionally tuned structures may include, for example, via structures that work for one exit layer but not for another exit layer and designs highly sensitive to aspects of a PCB that are loosely toleranced when manufactured.

Figure 1:
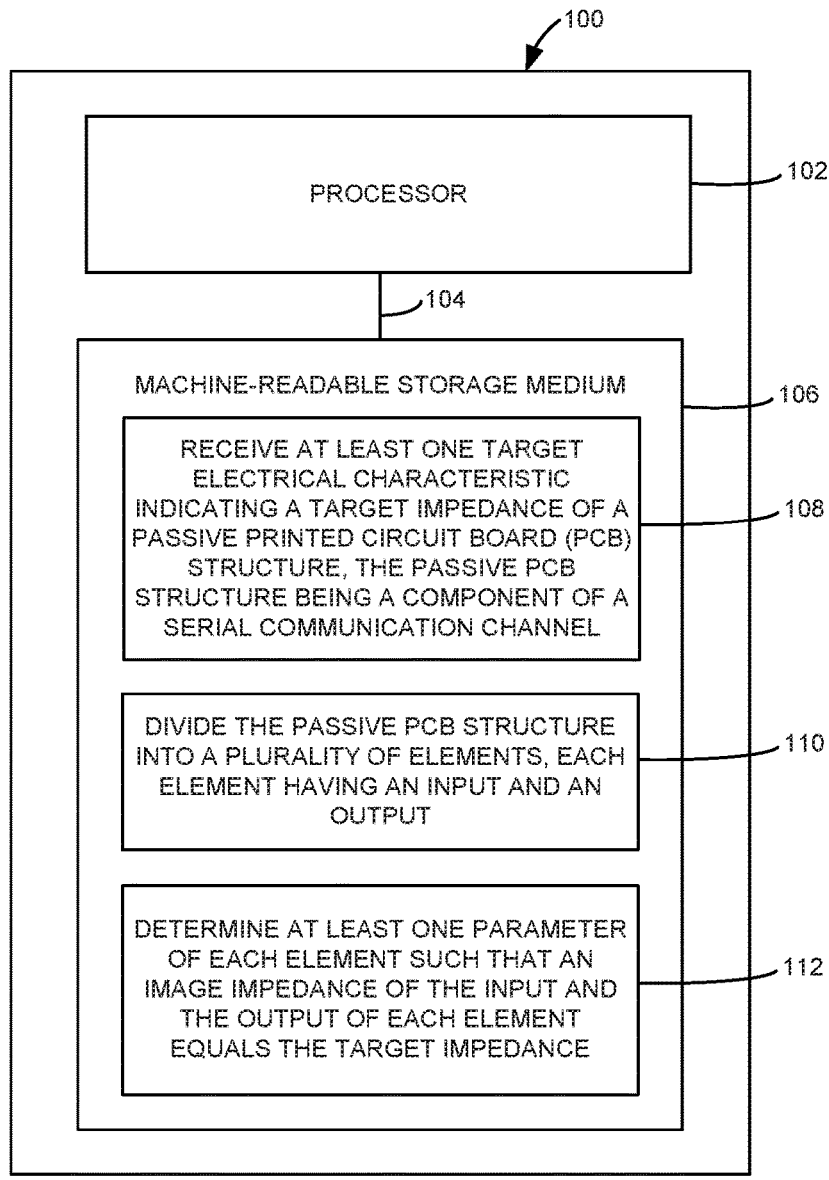
FIG. 1 is a block diagram illustrating one example of a processing system for determining parameters of printed circuit board (PCB) structures.

FIG. 1 is a block diagram illustrating one example of a processing system 100. System 100 includes a processor 102 and a machine-readable storage medium 106. Processor 102 is communicatively coupled to machine-readable storage medium 106 through a communication path 104. Although the following description refers to a single processor and a single machine-readable storage medium, the description may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 102 includes one or more central processing units (CPUs), microprocessors, and/or other suitable hardware devices for retrieval and execution of instructions stored in machine-readable storage medium 106. Processor 102 may fetch, decode, and execute instructions 108 to receive at least one target electrical characteristic indicating a target impedance of a passive PCB structure, the passive PCB structure being a component of a serial communication channel. In one example, the passive PCB structure includes a via structure or a plated through hole (PTH) structure. The target electrical characteristic may include a reflection coefficient and/or a return loss value and/or another suitable characteristic that indicates a target impedance of the passive PCB structure to achieve the target electrical characteristic. For a single-ended serial communication channel, the target impedance may be the characteristic impedance ($Z_o$) of the serial communication channel. For a differential serial communication channel, the target impedance may be the differential impedance ($Z_{diff}$) of the serial communication channel.

Processor 102 may fetch, decode, and execute instructions 110 to divide the passive PCB structure into a plurality of elements, each element having an input and an output. The passive PCB structure is intelligently broken into adjacent electrically small elements such that each element is suitable for analysis by computationally efficient electromagnetic simulation (e.g., 3D or 2D simulation) or other suitable optimization method.

Processor 102 may fetch, decode, and execute instructions 112 to determine at least one parameter of each element such that an image impedance of the input and the output of each element equals the target impedance. In one example, processor 102 may execute instructions to determine the at least one parameter of each element through electromagnetic simulation (e.g., 3D or 2D simulation). The at least one parameter of each element may include a dimension (e.g., length, width, thickness) of the element itself and/or a spacing between the element and another element that defines a parasitic capacitance and/or a parasitic inductance of the element.

Processor 102 may further execute instructions to receive the at least one target electrical characteristic indicating the target impedance over an operational bandwidth and further execute instructions to determine the at least one parameter of each element such that the image impedance of the input and the output of each element equals the target impedance over the operational bandwidth. In addition, processor 102 may further execute instructions to divide at least one element of the plurality of elements into a plurality of sub-elements and further execute instructions to determine at least one parameter of each sub-element such that the image impedance of the input and the output of the at least one element divided into the plurality of sub-elements equals the target impedance. This process of using sub-elements is useful for structures where matching the image impedance of each sub-element to the target impedance is not possible.

As an alternative or in addition to retrieving and executing instructions, processor 102 may include one or more electronic circuits comprising a number of electronic components for performing the functionality of one or more of the instructions in machine-readable storage medium 106. With respect to the executable instruction representations (e.g., boxes) described and illustrated herein, it should be understood that part or all of the executable instructions and/or electronic circuits included within one box may, in alternate examples, be included in a different box illustrated in the figures or in a different box not shown.

Machine-readable storage medium 106 is a non-transitory storage medium and may be any suitable electronic, magnetic, optical, or other physical storage device that stores executable instructions. Thus, machine-readable storage medium 106 may be, for example, random access memory (RAM), an electrically-erasable programmable read-only memory (EEPROM), a storage drive, an optical disc, and the like. Machine-readable storage medium 106 may be disposed within system 100, as illustrated in FIG. 1. In this case, the executable instructions may be installed on system 100. Alternatively, machine-readable storage medium 106 may be a portable, external, or remote storage medium that allows system 100 to download the instructions from the portable/external/remote storage medium. In this case, the executable instructions may be part of an installation package.

Figure 2:
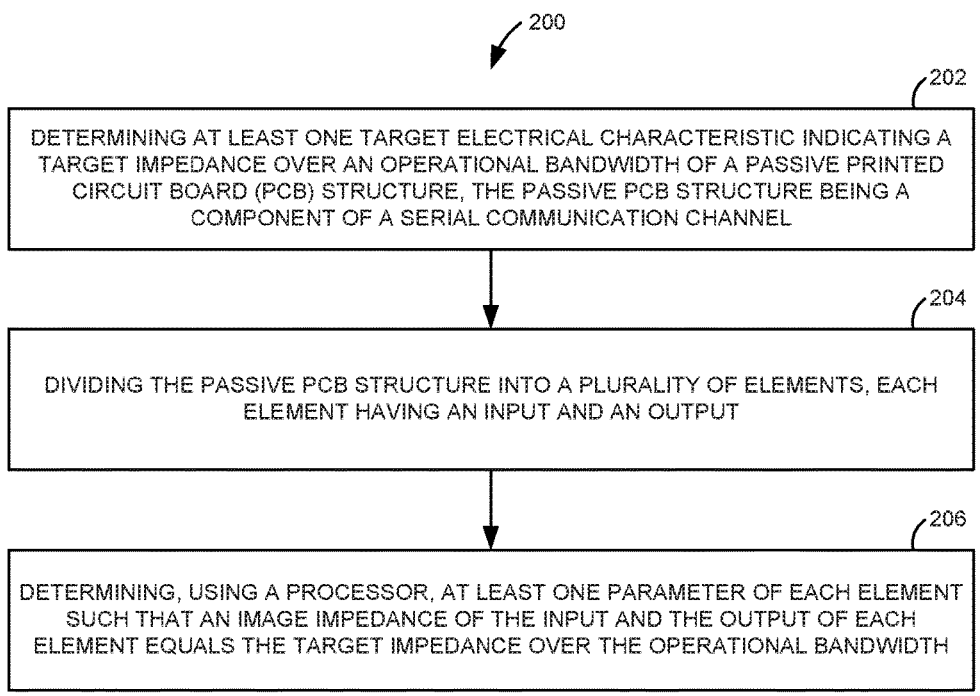
FIG. 2 is a flow diagram illustrating one example of a method for determining parameters of PCB structures.

FIG. 2 is a flow diagram illustrating one example of a method 200 for determining parameters of PCB structures. At 202, method 200 includes determining at least one target electrical characteristic indicating a target impedance over an operational bandwidth of a passive PCB structure, the passive PCB structure being a component of a serial communication channel. At 204, method 200 includes dividing the passive PCB structure into a plurality of elements, each element having an input and an output. At 206, method 200 includes determining, using a processor, at least one parameter of each element such that an image impedance of the input and the output of each element equals the target impedance over the operational bandwidth.

In one example, determining the at least one parameter of each element includes determining the at least one parameter through 3D or 2D simulation. Method 200 may also include dividing at least one element of the plurality of elements into a plurality of sub-elements and determining at least one parameter of each sub-element such that the image impedance of the input and the output of the at least one element divided into the plurality of sub-elements equals the target impedance over the operational bandwidth.

The passive PCB structure may include a via or a PTH, a first pad electrically coupled to a first side of the via or the PTH, a first signal trace electrically coupled to the first pad, a second pad electrically coupled to a second side of the via or the PTH, and a second signal trace electrically coupled to the second pad. Method 200 may also include after determining the at least one parameter of each element of the plurality of elements, analyzing the passive PCB structure using full-wave analysis to identify non transverse electromagnetic (TEM) effects and modifying at least one parameter of the passive PCB structure based on the results of the analysis to remove the non TEM effects.

Figure 3:
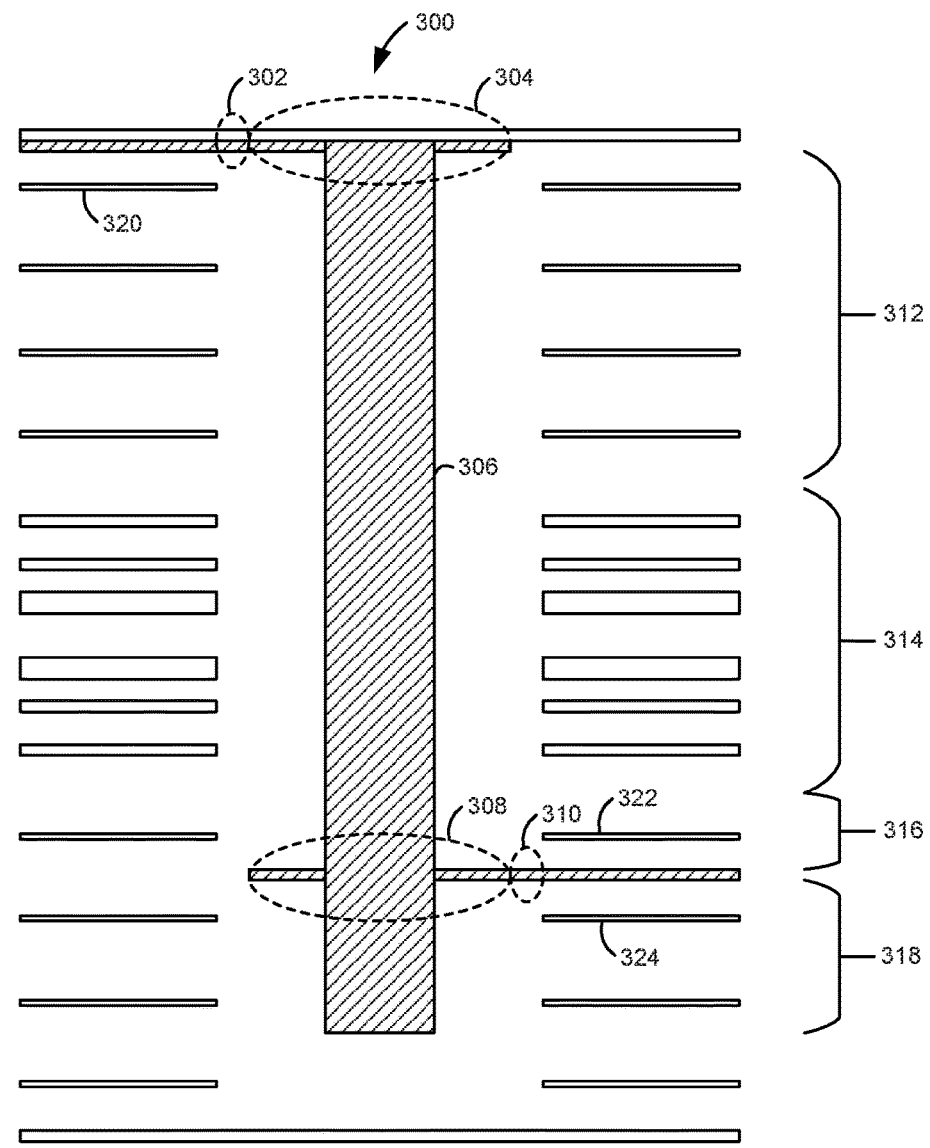
FIG. 3 illustrates a cross-sectional view of one example of a via structure of a PCB.

FIG. 3 illustrates a cross-sectional view of one example of a via structure of a PCB 300. The via structure includes a dereferenced microstrip element 302 (i.e., the portion of the signal trace to the via structure that does not overlap conductive layer 320, which provides a common or ground for the signal transmitted through the via structure), a first horizontal pad element 304, a vertical element 306, a second horizontal pad element 308, and a second dereferenced microstrip element 310 (i.e., the portion of the signal trace to the via structure that does not overlap conductive layer 322 and/or conductive layer 324, where at least one of conductive layers 322 and 324 provides a common or ground for the signal transmitted through the via structure). Vertical element 306 extends through a first signal sublaminate section 312, a power sublaminate section 314, a second signal sublaminate section 316, and a stub section 318 of PCB 300.

For minimal reflections, the image impedance at the input and the output of the via structure should equal the feeding transmission line impedance. Thus, the feeding transmission line impedance may be used as the target impedance for the via structure. The via structure may be divided into a plurality of elements and at least one parameter of each element may be determined such that an image impedance of an input and an output of each element equals the target impedance.

In one example, the via structure may be divided into the first dereferenced microstrip element 302, first horizontal pad element 304, the portion of vertical element 306 extending through first sublaminate section 312, the portion of vertical element 306 extending through power sublaminate section 314, the portion of vertical element 316 extending through second signal sublaminate 316, the portion of vertical element 306 extending through stub section 318, the second horizontal pad element 308, and the second dereferenced microstrip element 310. In other examples, at least two of the elements of the via structure identified above may be combined into a single element for analysis. For example, dereferenced microstrip element 302 and first horizontal pad element 304 may provide a first element, vertical element 306 may provide a second element, and second horizontal pad element 308 and second dereferenced microstrip element 310 may provide a third element. In any case, at least one parameter of each element is determined using electromagnetic simulation or another suitable process such that the image impedance of the input and the output of each element equals the target impedance.

Figure 4:
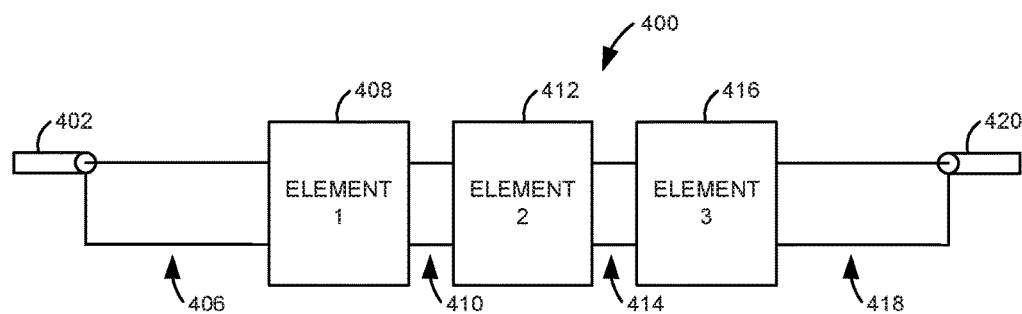
FIG. 4 is a block diagram illustrating one example of a model of the via structure illustrated in FIG. 3.

FIG. 4 is a block diagram illustrating one example of a model 400 of the via structure illustrated in FIG. 3. In this example, the via structure has been divided into three elements. In other examples, however, the via structure may be divided into another suitable number of elements. Model 400 includes a first feeding transmission line 402, a first element 408, a second element 412, a third element 416, and a second feeding transmission line 420.

First feeding transmission line 402 is electrically coupled to the input of first element 408 through a signal path 406. The output of first element 408 is electrically coupled to the input of second element 412 through a signal path 410. The output of second element 412 is electrically coupled to the input of third element 416 through a signal path 414. The output of third element 416 is electrically coupled to second feeding transmission line 420 through a signal path 418. In other examples, the input and the output of each element 408, 412, and 416, may be reversed.

The impedance of first feeding transmission line 402 and second feeding transmission line 420 may be set as the target impedance for each element 408, 412, and 416 to optimize each element 408, 412, and 416 such that the via structure as a whole is optimized. For example, for a first feeding transmission line 402 and a second feeding transmission line 420 having an impedance of 85 ohms, each element 408, 412, and 416 is optimized such that the image impedance of the input and the output of each element 408, 412, and 416 equals approximately 85 ohms. Each element 408, 412, and 416 may be optimized by determining at least one parameter of each element 408, 412, and 416 using electromagnetic simulation (e.g., 3D or 2D simulation) or another suitable process.

The at least one parameter of each element 408, 412, and 416 may include any parameter that modifies the image impedance of the input and the output of the element. For example, for first element 408 including horizontal pad element 304 (FIG. 3), the length and/or the width of horizontal pad element 304 may be adjusted until the image impedance of the input and the output of first element 408 equals the target impedance. In another example, for a second element 412 including vertical element 306, the distance between vertical element 306 and each conductive layer (e.g., 320, 322, and 324) within PCB 300 may be adjusted until the image impedance of the input and the output of second element 412 equals the target impedance. Likewise, for third element 416 including horizontal pad element 308, the length and/or the width of horizontal pad element 308 may be adjusted until the image impedance of the input and the output of third element 416 equals the target impedance.

Figure 5:
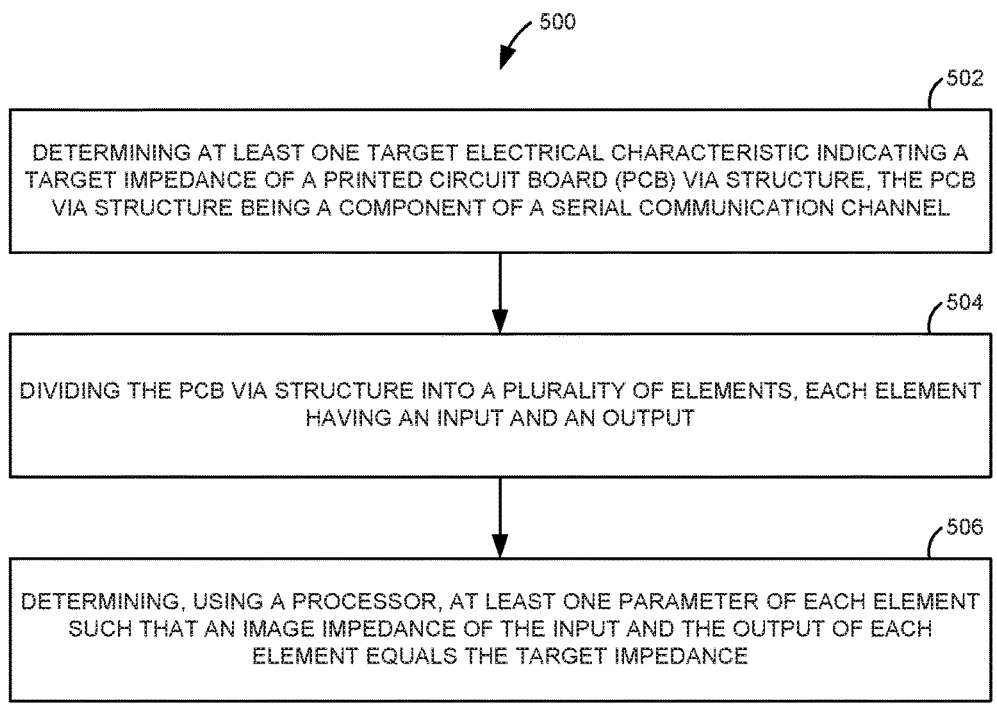
FIG. 5 is a flow diagram illustrating one example of a method for determining parameters of a via structure.

FIG. 5 is a flow diagram illustrating one example of a method 500 for determining parameters of a via structure. At 502, method 500 includes determining at least one target electrical characteristic indicating a target impedance of a PCB via structure, the PCB via structure being a component of a serial communication channel. At 504, method 500 includes dividing the PCB via structure into a plurality of elements, each element having an input and an output. At 506, method 500 includes determining, using a processor, at least one parameter of each element such that an image impedance of the input and the output of each element equals the target impedance.

In one example, dividing the PCB via structure into a plurality of elements includes dividing the PCB via structure into at least a first horizontal pad element, a second horizontal pad element, and a vertical element between the first horizontal pad element and the second horizontal pad element. Method 500 may also include dividing the vertical element into a plurality of sub-elements, each sub-element having a sub-input and a sub-output and determining at least one parameter of each sub-element such that an image impedance of the sub-input and the sub-output of each sub-element equals the target impedance. In another example, the at least one parameter of each sub-element may be determined such that an image impedance of the input and the output of the vertical element equals the target impedance.

Determining the at least one target electrical characteristic indicating the target impedance may include determining the at least one target electrical characteristic indicating the target impedance over an operational bandwidth and determining the at least one parameter of each element may include determining the at least one parameter of each element such that the image impedance of the input and the output of each element equals the target impedance over the operational bandwidth. Determining the at least one parameter of each element may include determining the at least one parameter of each element using two-dimensional simulation.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A machine-readable storage medium encoded with instructions, the instructions executable by a processor of a system to cause the system to:
   receive at least one target electrical characteristic indicating a target impedance of a passive printed circuit board (PCB) structure, the passive PCB structure being a component of a serial communication channel;
   divide the passive PCB structure into a plurality of elements, each element having an input and an output; and
   determine at least one parameter of each element such that an image impedance of the input and the output of each element equals the target impedance.

2. The machine-readable storage medium of claim 1, wherein the instructions are executable by the processor to further cause the system to:
   determine the at least one parameter of each element through electromagnetic simulation.

3. The machine-readable storage medium of claim 1, wherein the passive PCB structure comprises a via structure.

4. The machine-readable storage medium of claim 1, wherein the instructions are executable by the processor to further cause the system to:
   receive the at least one target electrical characteristic indicating the target impedance over an operational bandwidth; and
   determine the at least one parameter of each element such that the image impedance of the input and the output of each element equals the target impedance over the operational bandwidth.

5. The machine-readable storage medium of claim 1, wherein the instructions are executable by the processor to further cause the system to:
   divide at least one element of the plurality of elements into a plurality of sub-elements; and
   determine at least one parameter of each sub-element such that the image impedance of the input and the output of the at least one element divided into the plurality of sub-elements equals the target impedance.

6. A method comprising:
   determining at least one target electrical characteristic indicating a target impedance over an operational bandwidth of a passive printed circuit board (PCB) structure, the passive PCB structure being a component of a serial communication channel;

dividing the passive PCB structure into a plurality of elements, each element having an input and an output; and determining, using a processor, at least one parameter of each element such that an image impedance of the input and the output of each element equals the target impedance over the operational bandwidth.

7. The method of claim 6, wherein determining the at least one parameter of each element includes determining the at least one parameter through three-dimensional or two-dimensional simulation.

8. The method of claim 6, further comprising:
dividing at least one element of the plurality of elements into a plurality of sub-elements; and
determining at least one parameter of each sub-element such that the image impedance of the input and the output of the at least one element divided into the plurality of sub-elements equals the target impedance over the operational bandwidth.

9. The method of claim 6, wherein the passive PCB structure comprises a via or a plated through hole (PTH), a first pad electrically coupled to a first side of the via or the PTH, a first signal trace electrically coupled to the first pad, a second pad electrically coupled to a second side of the via or the PTH, and a second signal trace electrically coupled to the second pad.

10. The method of claim 6, further comprising:
after determining the at least one parameter of each element of the plurality of elements, analyzing the passive PCB structure using full-wave analysis to identify non transverse electromagnetic (TEM) effects; and
modifying at least one parameter of the passive PCB structure based on the results of the analysis to remove the non TEM effects.

11. A method comprising:
determining at least one target electrical characteristic indicating a target impedance of a printed circuit board (PCB) via structure, the PCB via structure being a component of a serial communication channel;
dividing the PCB via structure into a plurality of elements, each element having an input and an output; and
determining, using a processor, at least one parameter of each element such that an image impedance of the input and the output of each element equals the target impedance.

12. The method of claim 11, wherein dividing the PCB via structure into a plurality of elements comprises dividing the PCB via structure into at least a first horizontal pad element, a second horizontal pad element, and a vertical element between the first horizontal pad element and the second horizontal pad element.

13. The method of claim 12, further comprising:
dividing the vertical element into a plurality of sub-elements, each sub-element having a sub-input and a sub-output; and
determining at least one parameter of each sub-element such that an image impedance of the sub-input and the sub-output of each sub-element equals the target impedance.

14. The method of claim 11, wherein determining the at least one target electrical characteristic indicating the target impedance comprises determining the at least one target electrical characteristic indicating the target impedance over an operational bandwidth, and
wherein determining the at least one parameter of each element comprises determining the at least one parameter of each element such that the image impedance of the input and the output of each element equals the target impedance over the operational bandwidth.

15. The method of claim 11, wherein determining the at least one parameter of each element comprises determining the at least one parameter of each element using two-dimensional simulation.

* * * * *